United States Patent
Fawcett et al.

(10) Patent No.: US 6,239,586 B1
(45) Date of Patent: *May 29, 2001

(54) SYSTEM FOR DIGITAL MEASUREMENT OF BREAKDOWN VOLTAGE OF HIGH VOLTAGE SAMPLES

(75) Inventors: Timothy J. Fawcett, Runcorn; Neil S. Fore, Hale, both of (GB)

(73) Assignee: Hubbell Incorporated, Orange, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/095,091

(22) Filed: Jun. 10, 1998

(51) Int. Cl.[7] .................. G01R 17/16; G01R 29/00; G01R 31/08
(52) U.S. Cl. .................. 324/76.65; 324/76.79; 324/520
(58) Field of Search .................. 324/119, 76.12, 324/76.15, 76.24, 76.42, 123 R, 123 C, 76.65, 76.67, 76.79, 520, 521; 702/189, 89

(56) References Cited

U.S. PATENT DOCUMENTS

| | | | |
|---|---|---|---|
| 4,298,280 | * 11/1981 | Harney | 356/5.06 |
| 4,575,234 | * 3/1986 | Inbar | 324/76.24 |
| 4,578,667 | 3/1986 | Hollister | 340/347 |
| 4,651,102 | * 3/1987 | Inbar | 327/291 |
| 4,651,105 | * 3/1987 | Inbar | 327/58 |
| 4,965,512 | * 10/1990 | Debar et al. | 324/103 P |
| 5,121,413 | 6/1992 | Voegtly et al. | 375/95 |
| 5,315,527 | 5/1994 | Beckwith . | |
| 5,532,944 | 7/1996 | Battista . | |
| 5,534,675 | 7/1996 | Kaneko et al. . | |
| 5,544,064 | 8/1996 | Beckwith . | |
| 5,602,709 | 2/1997 | Al-Dabbagh . | |
| 5,631,584 | 5/1997 | Smith . | |
| 5,633,591 | 5/1997 | Childress et al. . | |
| 5,642,038 | 6/1997 | Kim et al. . | |
| 5,642,300 | 6/1997 | Gubisch et al. . | |
| 5,648,725 | 7/1997 | Divljakovic et al. . | |
| 5,682,106 | 10/1997 | Cox et al. . | |
| 5,726,561 | 3/1998 | Ghosh et al. . | |
| 5,767,684 | 6/1998 | Steenis . | |

OTHER PUBLICATIONS

DDX™ Partial Discharge Detector Product Brochure, Hipotronics, Inc., Copyright 1998.
970 Series System Controller Product Brochure, Hipotronics, Inc., Copyright 1996.

* cited by examiner

Primary Examiner—Safet Metjahic
Assistant Examiner—Jermele M. Hollington
(74) Attorney, Agent, or Firm—Jerry M. Presson; Stacey J. Longanecker

(57) ABSTRACT

A breakdown voltage measurement system is provided which employs a digital peak detection circuit for peak voltage measurement. The breakdown voltage measurement system employs a voltage memory device for storing successive peak values obtained from the digital peak detection circuit. The breakdown voltage measurement system is programmable to commence searching of stored peak values following breakdown of a sample electrical device being tested to determine a voltage measurement immediately before the breakdown occurred.

8 Claims, 10 Drawing Sheets

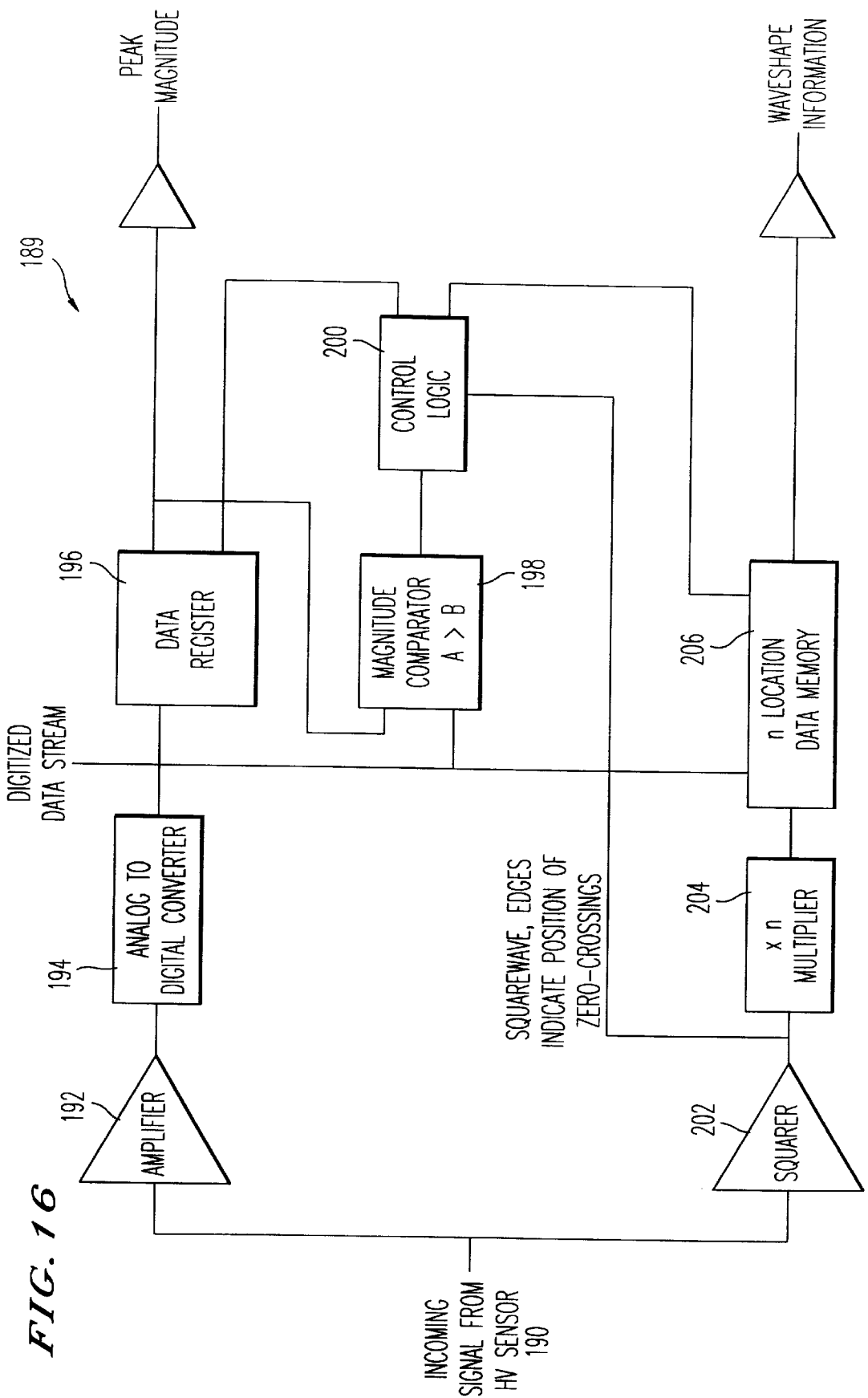

SYSTEM FOR DIGITAL MEASUREMENT OF BREAKDOWN VOLTAGE OF HIGH VOLTAGE SAMPLES

CROSS REFERENCE TO RELATED APPLICATIONS

Related subject matter is disclosed and claimed in co-pending U.S. patent application Ser. No. 09/095,092 of Dr. Timothy James Fawcett et al, filed on Jun. 10, 1998, and entitled "System For Measuring Partial Discharge Using Digital Peak Detection" and in co-pending U.S. patent application Ser. No. 09/095,093 of Dr. Timothy James Fawcett et al, filed on Jun. 10, 1998, and entitled "System For Concurrent Digital Measurement Of Peak Voltage And RMS Voltage In High Voltage System" both of said applications being expressly incorporated herein by reference.

FIELD OF INVENTION

The invention relates to a system for measuring breakdown voltage.

BACKGROUND OF THE INVENTION

In a breakdown voltage measurement system, the height of pulses in a signal is considered. Amplification is generally performed before the pulses are measured. For example, a band-limited amplifier is typically used to increase the magnitude of the pulses. Pulse height is then measured using an analog peak detection system. With reference to FIG. 1, an analog peak detector 2 uses a comparator 4 to charge a capacitor 6 through a diode 8. As long as the voltage on the capacitor 6 is less than the voltage of the pulse, the capacitor 6 is charged by the comparator 4. Once the voltage on the capacitor 6 exceeds that of the pulse, charging is stopped. The output voltage of the analog peak detector 2 at this point is equal to the highest voltage that has occurred on the input 3. When a data acquisition system is used to detect and measure individual pulses, the detector 2 must be reset by discharging the capacitor 6 after a pulse has been measured in order to be ready for the next pulse.

It is difficult to configure an analog peak detector of this type to be accurate. The analog peak detector relies on a non-linear feedback loop, which is dependent very heavily on the characteristics of the peak detection system. The delay around the peak detection system, particularly through the comparator 4 and an output buffer, causes the voltage of the output of the analog peak detector to lag fractionally with respect to the input, resulting in an overshoot on the output. The magnitude of this overshoot is typically non-linear with voltage, thereby limiting the accuracy of the system.

It is also necessary with an analog peak detector to compromise on the capacitor 6 used for peak detection. The voltage on the capacitor 6 tends to "droop" once the comparator 4 has stopped charging the capacitor because of leakage currents in the system. This introduces an uncertainty in the measurement, since the voltage decreases by some amount before the magnitude is measured. This effect can be limited by using a larger capacitance. A larger capacitance, however, requires more current for charging, resulting in a lower rate of change of voltage and limiting the maximum frequency that can be used for the amplifier. Thus, loop delays in the analog peak detection system are increased. A further complication is introduced when a reset is required on the analog peak detector. Charge injection from a reset switch can result in offsets on the output of the analog peak detector 2, which further limits the accuracy of the partial discharge measurement system. Accordingly, a need exists for a voltage measurement system which allows for more accurate peak detection. In addition, a need exists for a breakdown voltage measurement system which overcomes inaccuracies due to the generate of inaccurate and invalid voltage readings following a breakdown in a sample being tested. After a sample being tested breaks down, a voltage reading is indeterminate and invalid for a finite delay period extending from the time of the breakdown until the removal of the high voltage from the sample.

SUMMARY OF THE INVENTION

In accordance with an aspect of the present invention, a breakdown voltage measurement system is provided which comprises a computer and a digital peak detection circuit configured to perform digital peak measurement on signals.

In accordance with another aspect of the present invention, the digital peak detection circuit generates interrupt inputs to the computer. The computer is programmed in accordance with an interrupt handler routine to read peak voltage on each cycle of a high voltage waveform. The computer stores a plurality of successive voltage readings in a buffer and a current set point for the output voltage. When the sample being tested breaks down, the computer searches backwards through the buffer to locate a stored voltage reading representing the last voltage reading that occurred before the sample broke down.

BRIEF DESCRIPTION OF THE DRAWINGS

These and other features and advantages of the present invention will be more readily comprehended from the following detailed description when read in connection with the appended drawings, which form a part of this original disclosure, and wherein:

FIG. 16 is a system for concurrently measuring peak voltage and peak-to-RMS voltage constructed in accordance with an embodiment of the present invention.

DETAILED DESCRIPTION OF THE PREFERRED EMBODIMENTS

Figure 2:
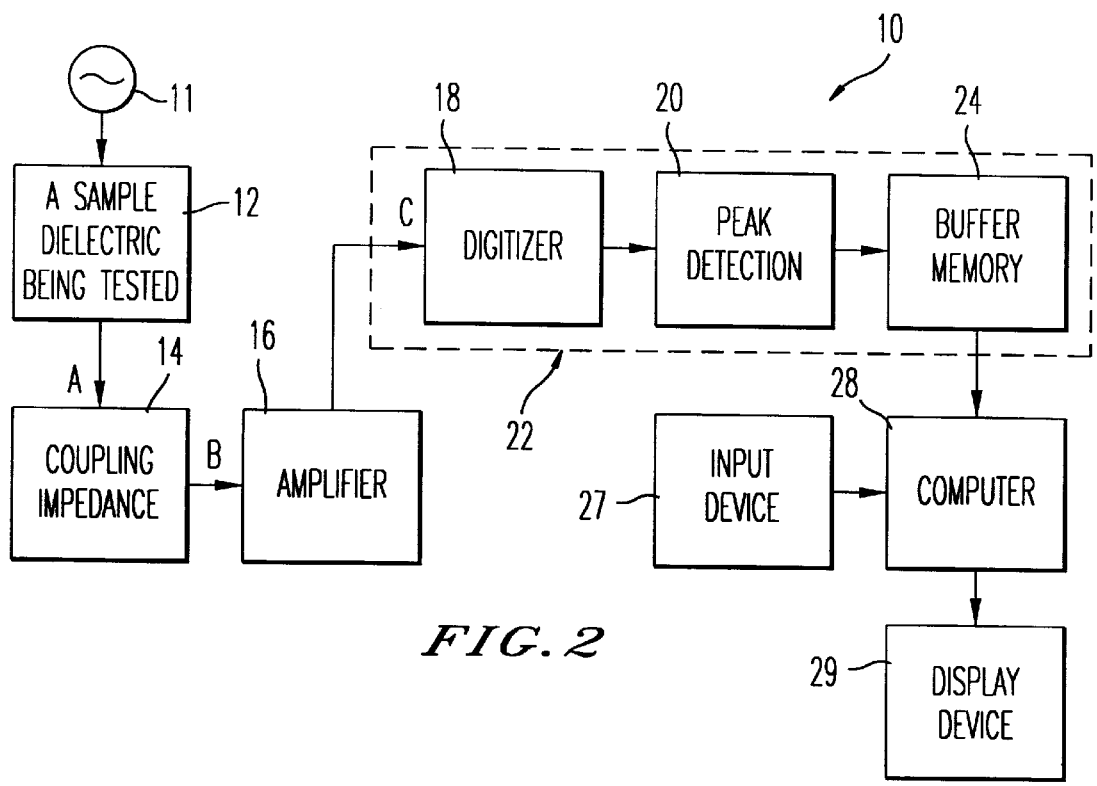
FIG. 2 is a block diagram of a conventional partial discharge measurement system.
Figure 3:
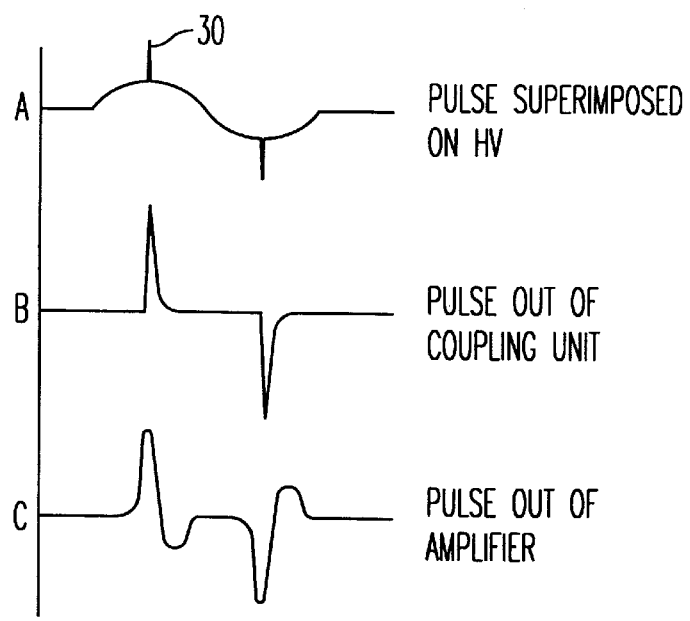
FIG. 3 illustrates waveforms generated by the partial discharge measurement system depicted in FIG. 2.

A block diagram of a digital partial discharge measurement (PDM) system 10 which implements digital peak detection and is constructed in accordance with the present invention is provided in FIG. 2. Signal waveforms A, B, and C, at the outputs of various components in the digital partial discharge detection PDM system 10 are illustrated in FIG. 3. Applications for the PDM system 10 include, but are not limited to, testing and monitoring power cable, distribution and power transformers, medium and high voltage switch gear, power circuit breakers, gas insulated switch gear, bushings, shunt reactors, potential and current transformers, power factor correction capacitors, line insulator products, lightening arrestors, among other high voltage components and insulating materials of all types.

A sample 12 (e.g., insulation system sample) which is to undergo partial discharge detection using the PDM system 10 is connected to a coupling impedance 14. As stated previously, the system is not steady-state and pulses are frequently superimposed on the high voltage waveform conducted across the sample 12 from a high voltage source 11. With reference to FIG. 3, the waveform provided to the coupling impedance 14 is illustrated as waveform A. The magnitude of the pulse 30 superimposed on the high voltage waveform A has been exaggerated for illustrative purposes. The output of the coupling impedance 14 is depicted as waveform B in FIG. 3. Following processing by amplifier 16, the pulse can appear as the waveform C in FIG. 3.

With continued reference to FIG. 2, digital peak detection is performed by a peak detection circuit 22 comprising a digitizer 18, and peak detection and processing logic 20, which are described in further detail below. The output of the peak detection logic 20 is passed to a buffer memory 24 and subsequently to a computer 28. The computer 28 operates in a conventional manner with an input device 27 and a display device 29 and performs processing and display functions.

As stated previously, an improved system is provided in accordance with an embodiment of the present invention for measuring the peak of a voltage signal wherein information from the amplifier 16 is converted into a digital information stream and processed digitally. Because of the non-periodic nature of the discharge activity, it is not sufficient to merely select a sampling frequency above the Nyquist frequency of the amplifier (i.e., greater than twice the maximum cut-off frequency of the amplifier).

Figure 4:
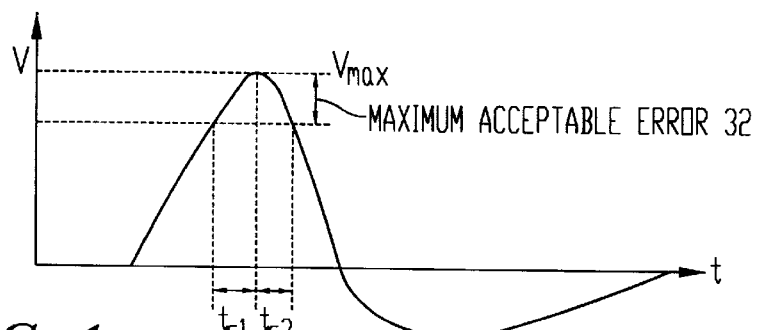
FIG. 4 illustrates the output of an amplifier in a peak detection system and the parameters for determining a minimum sample rate in accordance with an embodiment of the present invention.

With reference to FIG. 4, it is advantageous to consider the shape of the top of a discharge pulse, when passed through the coupling impedance 14 and the amplifier 16, and to determine the time from the highest point of the pulse to the point where it has fallen by less than ½ Least Significant Bit (LSB) of the digitizer to be used. The minimum sample rate is preferably the largest of $t_{S1}$ or $t_{S2}$. The maximum acceptable error is indicated at 32. As the upper frequency limit of the amplifier 16 is increased, there is a corresponding increase in the sampling rate required. There is also an increase in the sampling rate required if the peak detection process implemented in the PDM system 10 moves to a higher sampling resolution. Accordingly, a suitable sampling rate is selected based on the amplifier characteristics and the required system resolution in accordance with the present invention.

Once the pulse stream has been digitized, the peak detection process can be carried out using a digital processing system which does not exhibit the deficiencies of an analog peak detector. This eliminates the major inaccuracy associated with an analog discharge detector. A digital peak detection system is more complex than an analog peak detector, which uses a relatively simple circuit. A digital peak detection system employs a significant amount of logic. Further, the logic is required to run at a relatively high rate because of the high sampling speeds used. A digital solution has recently become economically viable due to developments in Field Programmable Gate Array (FPGA) technology and digital imaging. FPGA systems now exist which combine multiple, thousand-gate capacities, along with operating speeds suitable for the required sampling rates. FPGA technology allows the development of complex logic systems which would have previously required custom integrated circuits (IC) design. FPGA technology is supported by developments in the digital imaging field, which have brought high-speed, low cost memories and high-speed, high-resolution analog-to-digital converters to the marketplace. By combining these two technologies, a digital PDM system 10 constructed in accordance with the present invention can exceed analog detectors and hybrid detectors having both analog and digital components in performance while being price competitive with existing instruments. The digital PDM system 10 provides more flexibility than its analog or hybrid counterparts because it is possible to reconfigure the operation of the pulse detection system to suit the way the data is to be processed and the constraints on it.

The PDM system 10 preferably provides three basic modes of operation used in different applications. The basic modes are: (1) general purpose measurement and pulse display; (2) pulse capture and analysis; and (3) time dependent pulse capture. When operating in general purpose measurement and display mode, the PDM system 10 most closely mimics the operation of a traditional instrument. This mode is optimized to provide the fastest possible update rate on a system display to allow the PDM system 10 to mimic the characteristics of an analog cathode-ray oscilloscope.

Figure 1:
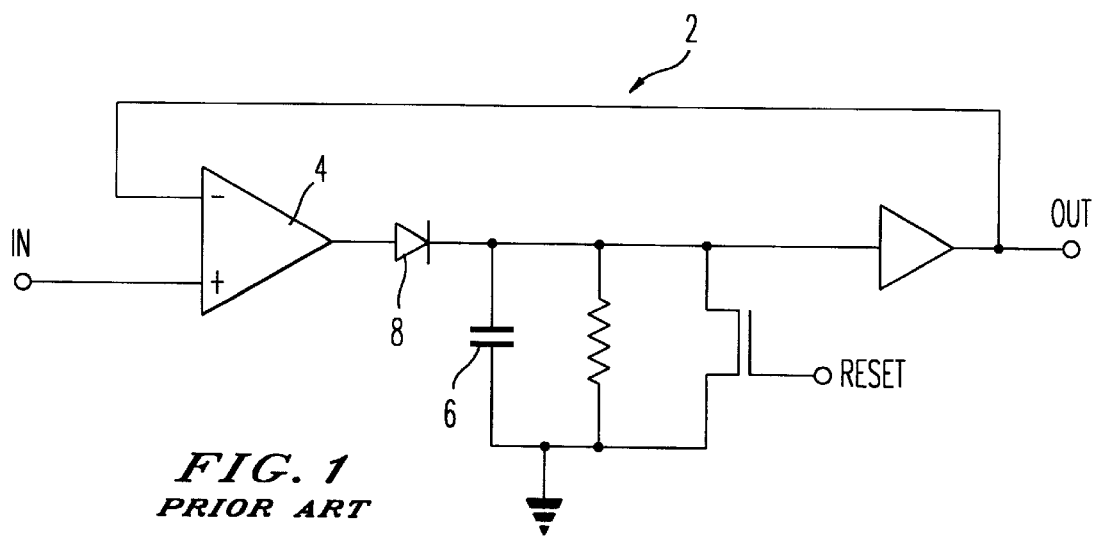
FIG. 1 is a schematic diagram of an analog peak detector.
Figure 5A:
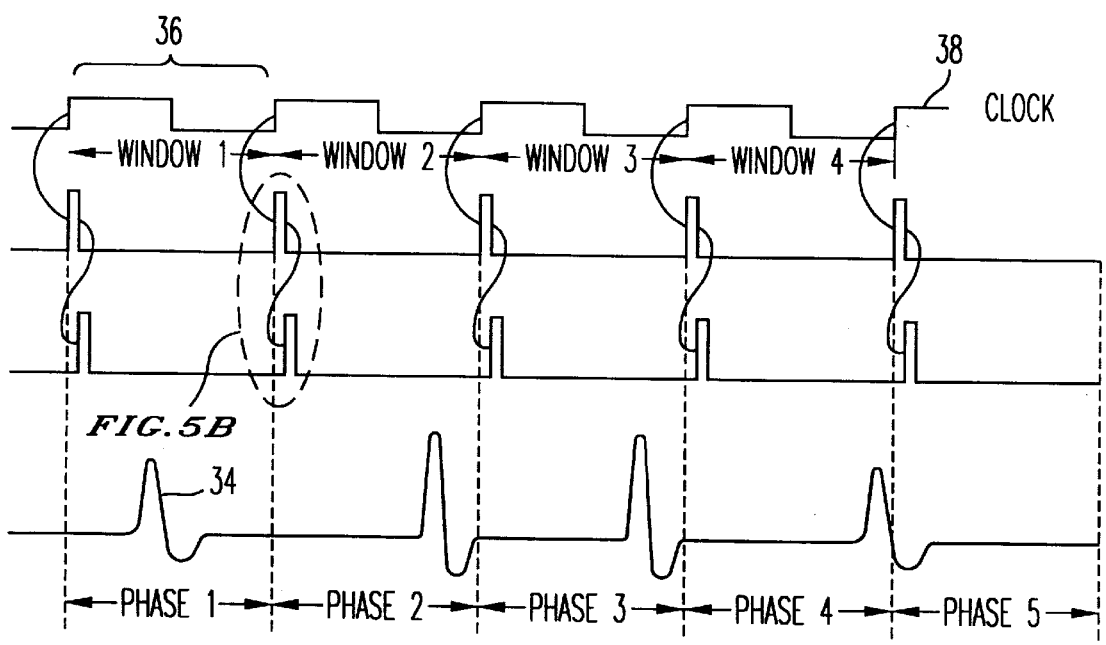
FIGS. 5A and 5B illustrate peak capture by a peak detection system operating in a general purpose peak capture mode in accordance with an embodiment of the present invention.
Figure 5B:
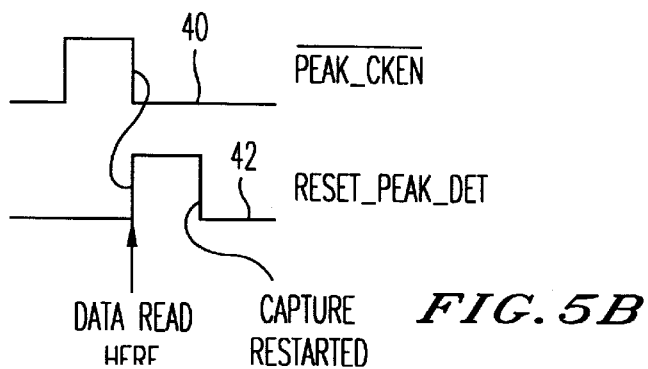

With reference to FIGS. 5A and 5B, individual pulses (e.g., pulse 34) are captured in fixed windows (e.g., window 36), taking into account the positive and negative peak magnitudes. The pulses are each stored in a capture memory 24 based on their position in the cycle, and the number of cycles that have elapsed since the last time the capture memory was read. Having the phase implicit in the position of a pulse in the capture memory simplifies the process of writing the individual pulses onto the system display 29 by minimizing the calculation required. Where pulses occur so close together that they occupy a single phase position, the PDM system 10 records the highest pulse and indicates the highest pulse on the system display 29. This avoids the PDM system 10 having to write a pulse to the display 29, only to draw over the current display with a larger pulse. This mode guarantees that the highest discharge magnitude pulse is measured, but does not guarantee to resolve all pulses under all situations. In other words, multiple pulses occurring in one window 36 yields one result, while a single pulse crossing two windows yields two results. This mode does, however, provide a fast update rate (e.g., typically 25 times per second) combined with an accurate discharge magnitude measurement. The display produced looks like that on an analog display, in that it is bipolar and can display the overshoot on a pulse (i.e., a pulse occurring concurrently with the tail of another pulse). This makes the PDM system 10 comfortable for a user used to traditional instruments. The general operation mode is not suitable when it is required to look at the statistics of discharge activity. For example, when discharge fingerprinting is to be performed, all of the pulses in a defined interval must be captured. Where there is an advantage to be gained in the general purpose mode by capturing the overshoot of the pulses to provide a more realistic display, it should be avoided in the pulse capture and analysis mode. The clock signal 38, the clock enable signal 40 and the reset signal 42 in FIG. 5B are described below in connection with FIGS. 10–12.

Figure 6:
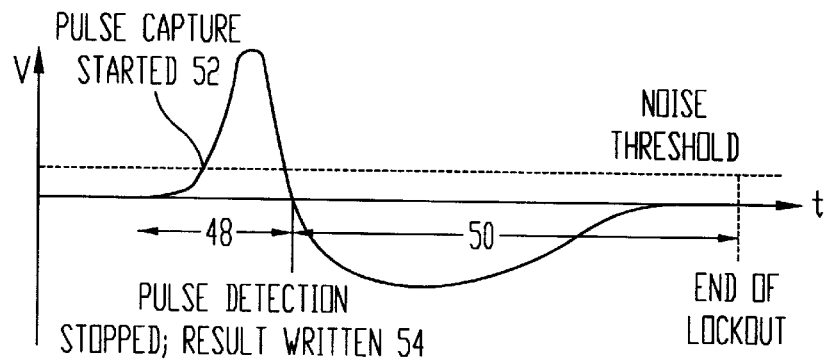
FIG. 6 illustrates peak capture by a peak detection system operating in a single pulse capture mode in accordance with an embodiment of the present invention.

With regard to the pulse capture mode and FIG. 6, the pulse polarity is taken from the first part 48 of a pulse 34. The process is interrupted once the pulse crosses through the zero point and until a specific time interval for lock-out has elapsed, as described in connection with FIG. 9. Pulse capture preferably begins at point 52 in FIG. 6. Pulse detection is interrupted at the zero-crossing (i.e., point 54) and the result is written to a capture memory. Pulse detection remains interrupted or locked-out until the end of the tail 50 (i.e., point 56) to avoid capturing overshoot.

Figure 7:
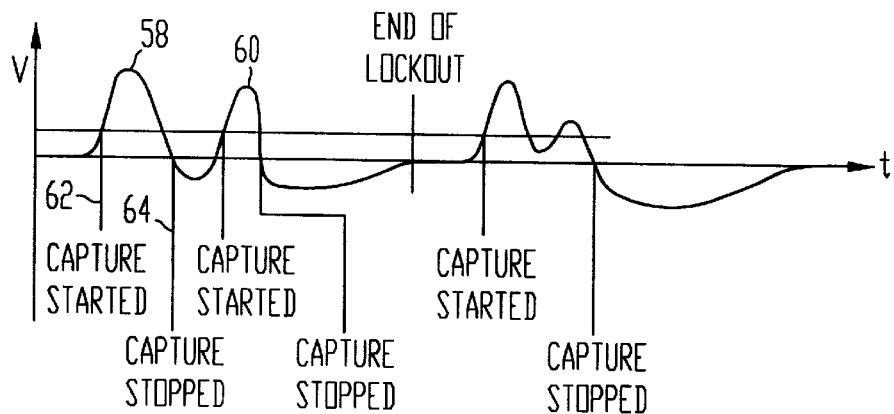
FIG. 7 illustrates peak capture by a peak detection system operating in a multiple pulse capture mode in accordance with an embodiment of the present invention.

Ordinarily, the tail 50 on the pulse 34 can be long (e.g., on the order of 20 microseconds) and this length imposes an unacceptable limit on pulse resolution when the discharge activity is close together, as shown in FIG. 7. Accordingly, if the PDM system 10 detects a second pulse 60 falling into the tail of a first pulse 58, that is of the same polarity, the PDM system 10 is re-triggered. Thus, the second pulse 60 is captured, as well as the first pulse 58. The criterion for this re-triggering is that the pulse 60 crosses through the zero point before re-triggering can occur. In this case, the pulse information is stored as magnitude-plus-phase and cycle. This is more suitable for statistical processing, but imposes an overhead on display updating which limits its effectiveness. With continued reference to FIG. 7, pulse capture for the first pulse 58 begins at point 62 and stops at the zero-crossing (point 64) for that pulse 58. The second pulse 60 occurring in the tail of the first pulse 58 causes re-triggering (point 66). Pulse capture for the second pulse 60 ceases at the zero-crossing of the second pulse (i.e., point 68). Lock-out occurs until point 70. Capture of a third pulse 71 commences at point 72. A fourth pulse 73 is treated as a single pulse with the third pulse 71 because no zero-crossing occurs therebetween. Capture of the pulses 71 and 73 is treated as a single event and the result is not written until the zero-crossing at point 74.

The third mode of operation is the time-dependent pulse capture mode. This is the simplest mode of operation. Once the PDM system 10 is triggered when operating in this mode, the PDM system 10 fills up a pulse capture memory 24 with successive samples taken from the ADC. In this mode, there is no attempt made to capture the peaks of the pulses. Accordingly, no measurement of discharge magnitude is made. The primary use of this mode is for fault location in cables. The position of pulses within a cable can be found by measuring the time interval between a pulse and its reflection. By comparison with the time for a pulse to travel the full length of the cable and return to an originating point, the position of the fault from the far end of the cable can be located. This mode also provides diagnostic facilities because it allows the pulse shape to be studied to optimize the band width of the system. Also, because of the time-based capture, this mode allows the measurement of interference frequencies such that suitable filtering can be implemented.

Figure 8:
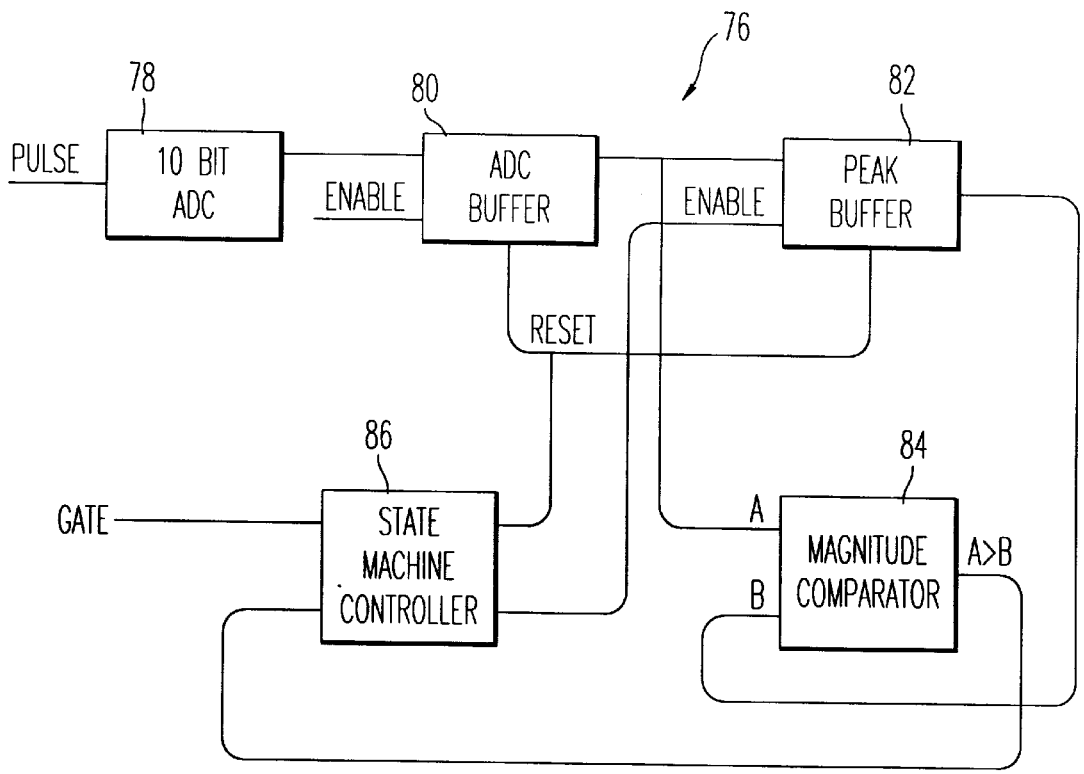
FIG. 8 is a block diagram of a peak detector for a positive polarity signal constructed in accordance with an embodiment of the present invention.

The computer 28 in the digital discharge detection PDM system 10 is preferably a personal computer running on Windows 95™-based software, for example. The computer 28 is figured to allow flexible test recording and data exporting to different software programs such as Word™ and Excels™. The computer 28 is programmed to provide a flexible analysis tool for digital partial discharge detection. Pulse capture is achieved against phase or time coordinates. Different modes of operation are provided for full control over gating of pulses in both the vertical and horizontal axes. As stated previously, FPGA technology is preferably used for peak detection and operations in conjunction with the central processing unit board of the computer 28. A block diagram of the FPGA peak detector is provided in FIG. 8. As described above in connection with FIG. 2, pulses from the amplifier 16 are provided to the FPGA peak detector 22 before they are digitized using an analog-to-digital converter (ADC). The ADC is preferably a 10-bit ADC to provide 9-bit resolution a sign bit. The output of the ADC 78 is provided to a two-stage pipeline comprising the ADC buffer 80 and a peak buffer 82. The values in both stages 80 and 82 of a pipeline are provided to a magnitude comparator 84. A state machine controller 86 provides gate control to determine the time window within which peak detection is performed, as described in connection with FIGS. 11 and 12. The state machine also controls the clocking of the pipeline and resetting of values in the pipeline.

Figure 9:
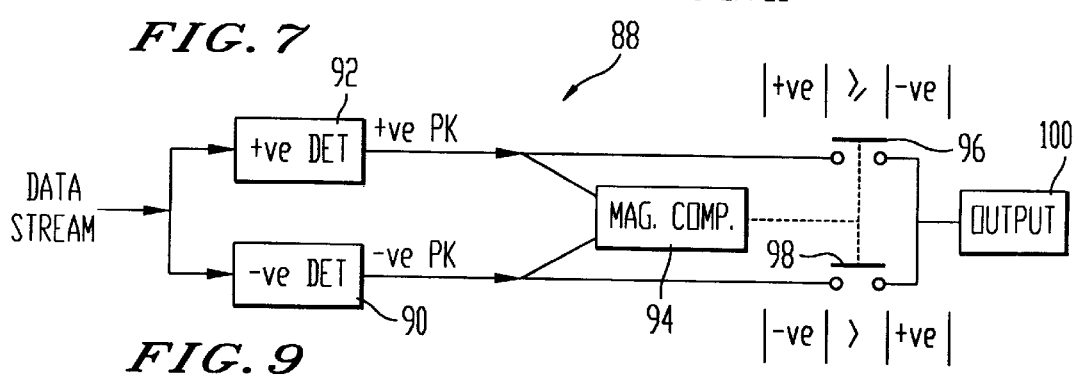
FIG. 9 is a block diagram of a peak detector for positive and negative polarity signals and constructed in accordance with an embodiment of the present invention.

The accuracy of the digital peak detection process of the present invention is enhanced by the detection of both positive and negative slope on voltage signals, along with controlling the shape of the pulse capture window in accordance with a selected mode of operation (e.g., the general purpose capture mode illustrated in FIGS. 5A and 5B or the pulse capture analysis mode illustrated in FIGS. 6 and 7). An overall structure for a peak detection system 88 which is constructed in accordance with a preferred embodiment of the present invention is illustrated in FIG. 9. The peak detection system 88 comprises two peak detector circuits 90 and 92 for determining the peaks of both positive and negative polarity voltage signals −Ve and +Ve, respectively. Each peak detector circuit 90 and 92 is preferably configured as shown in FIGS. 8 and 10–12. The outputs of the peak detector circuits 90 and 92 are compared using another magnitude comparator 94, which controls the operation of two switching devices 96 and 98. The positive or negative polarity signal having the largest absolute peak value is provided to an output 100 by a corresponding one of the switching devices 96 and 98. The value at the output 100 is preferably accessed using the computer 28 for analysis, or display purposes or both.

Figure 10:
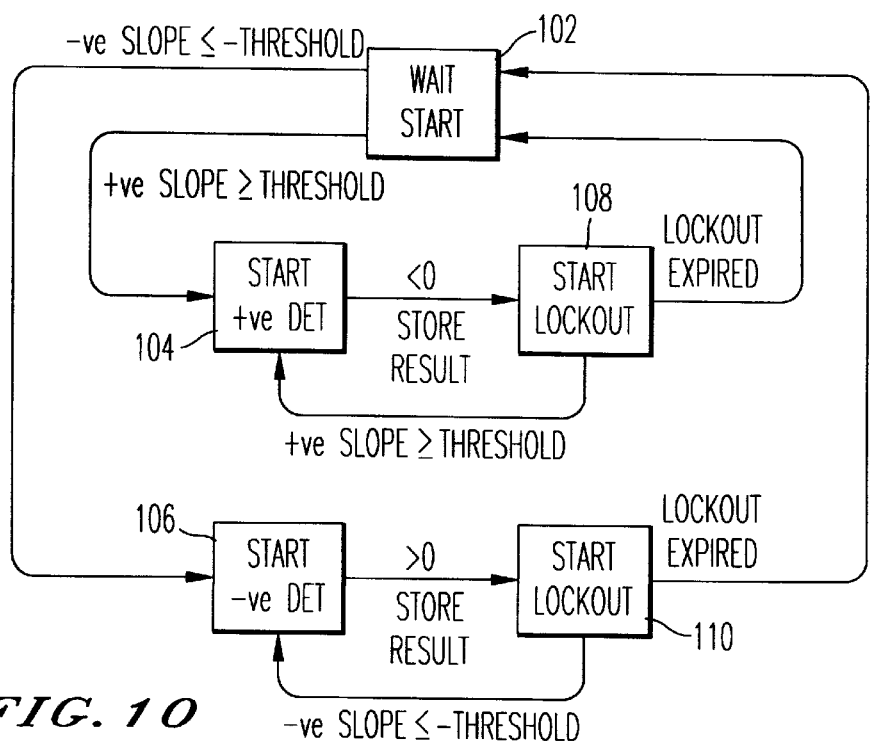
FIG. 10 is a diagram illustrating a method of positive and negative peak detection in accordance in accordance with an embodiment of the present invention.

The detection of positive and negative slope (e.g., −Ve and +Ve) during the pulse capture analysis mode is illustrated in FIG. 10. Following start-up of the peak detection system 88 (state 102), peak detection for both positive and negative polarity signals +Ve and −Ve commences (states 104 and 106), respectively. As discussed above in connection with FIGS. 6 and 7, peak detection continues until a zero-crossing occurs in the signals. The lock-out interval is then initiated and commences (states 108 and 110). The result of the detection states 104 and 106 are stored in a memory device as long as the slope of the +Ve signal is greater than or equal to a selected threshold (e.g., a threshold selected for noise) and the slope of the −Ve signal is lesser than or equal to a selected threshold. After the lock-out interval expires, the peak detection states 104 and 106 can be entered again.

An illustrative implementation of the peak detection circuit 92 will now be described in connection with a schematic diagram in FIG. 11 and a state diagram in FIG. 12. The sign bit from a signal output from the ADC 78 (FIG. 8) is provided to a NOR gate 114, along with a CGATE signal. The output of the gate 114 is connected to a first ADC register which is hereinafter referred to as the ADC0 register. The CGATE input is an external inhibiting input for disabling the ADC0 register as long as the CGATE input is asserted. Thus, sections of an input pulse train can be locked-out from being measured when another part of the PDM system 10 determines the input data to be invalid. For example, the PDM system 10 may have determined that noise and phase-related noise is adversely affecting the integrity of the input signal and therefore the integrity of the output derived therefrom. The ADC0 register can also be disabled when a signal having a negative polarity appears at an input of the register ADC0. The implementation of the peak detection circuit 94 is substantially the same as the schematic diagram depicted in FIG. 11, except that the ADC_IN[9:0] input to the gate 114 is inverted and the registers ADC0, ADC1 and PEAK0 are preset with a value, as opposed to being cleared as explained below.

As stated previously, the sample ADC_IN[9:0] at the output of the 10-bit ADC 78 is provided to a first register ADC0. In addition to the register ADC0, the ADC buffer 80 (FIG. 8) comprises another register ADC1 which receives the output ADC_PRE[8:0] of the first register ADC0. The second register ADC1 is connected to a register PEAK0 which constitutes the peak buffer 82 depicted in FIG. 8. The output of the first register ADC0 is provided to first and second comparators COMP0 and COMP1. The comparators COMP0 and COMP1 are preferably 9-bit unsigned comparators. The output of second register ADCI is provided to comparator COMP0, while the output of register PEAK0 is provided to the other comparator COMP1. The comparators COMP0 and COMP1 compare the contents of register ADC0 with register ADC1 and the contents of register ADC0 with register PEAK0, respectively. Two latches ADCLT0 and ADCLT1 are provided at the outputs of the comparators. A register GATE_PIPE is provided for generating a control signal GATE. The GATE signal is an internally generated signal (i.e., within the FPGA peak detection circuit 92 or 94) that indicates the start and finish of the data acquisition period. For instance, if the system is in the general purpose measurement and pulse display mode, this signal is high during the sample period corresponding to the current memory location. As soon as the phase moves outside that window, the GATE signal goes low to initiate a readout and then high to enable the capture for the next window. The state machine 86 is programmed to implement the state diagram depicted in FIG. 12.

Figure 11:
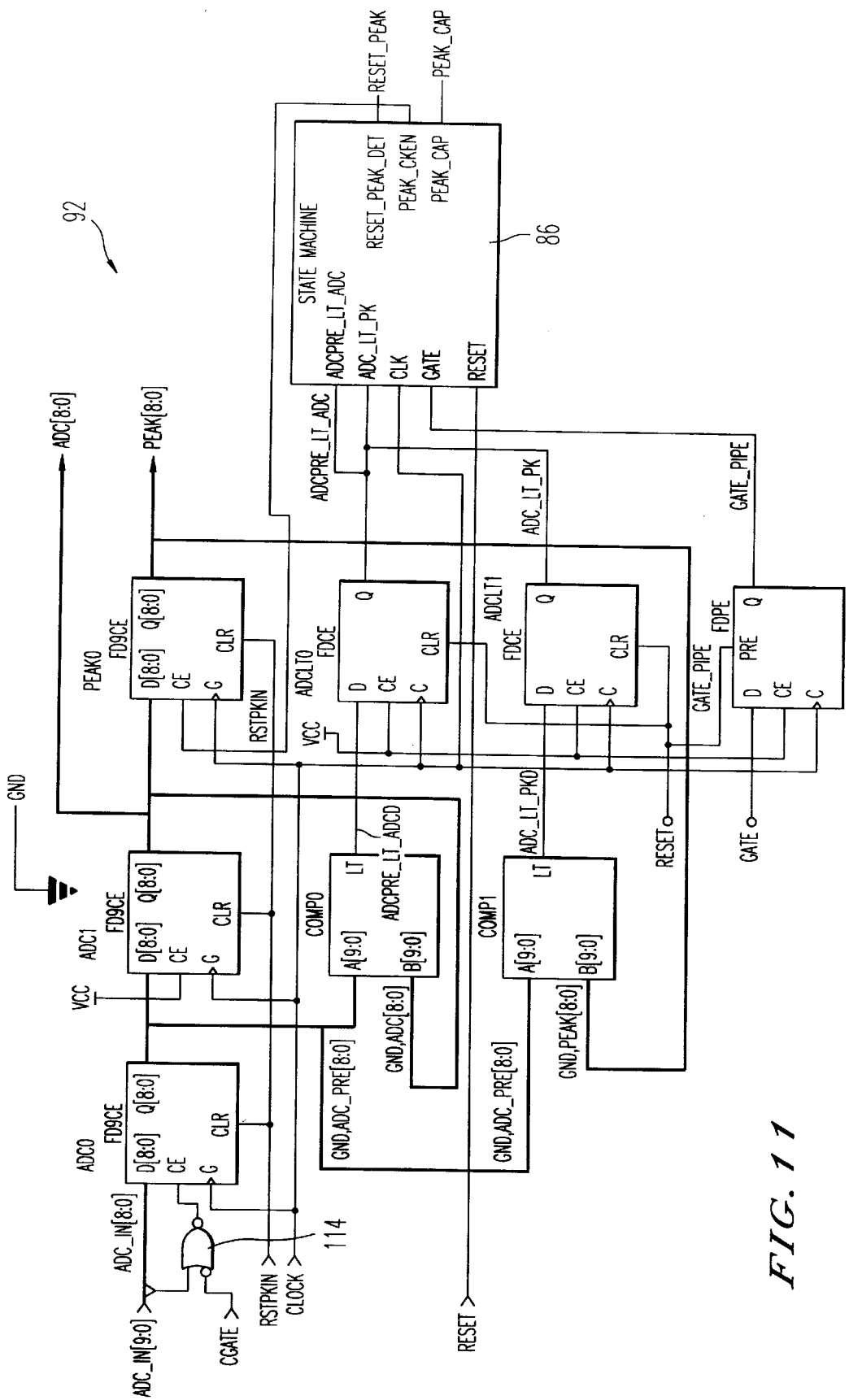
FIG. 11 is a schematic diagram of a peak detector constructed in accordance with an embodiment of the present invention.

With continued reference to FIG. 11, when the control signal GATE is high, and the sample in the register ADC0 is less than the sample in the register ADC1 as determined by the comparator COMP0, the clock enable for register PEAK0 is disabled on the following cycle. The register PEAK0, therefore, holds the peak value. The PEAK register is re-enabled when the sample in the register ADC0 is greater than the value held in the register PEAK0 as determined by the comparator COMP1. The peak value ADC_IN[9:0] is captured until the control signal GATE becomes false. The value in the PEAK0 register is then stored in, for example, external circuitry. The output PEAK_CAP of the state machine indicates when the peak value is being updated. The pipeline technique is advantageous because it increases the speed at which the circuit depicted in FIG. 9 can operate. The circuit can operate at data rates on the order of 80 megahertz when implemented in current FPGA devices.

Figure 12:
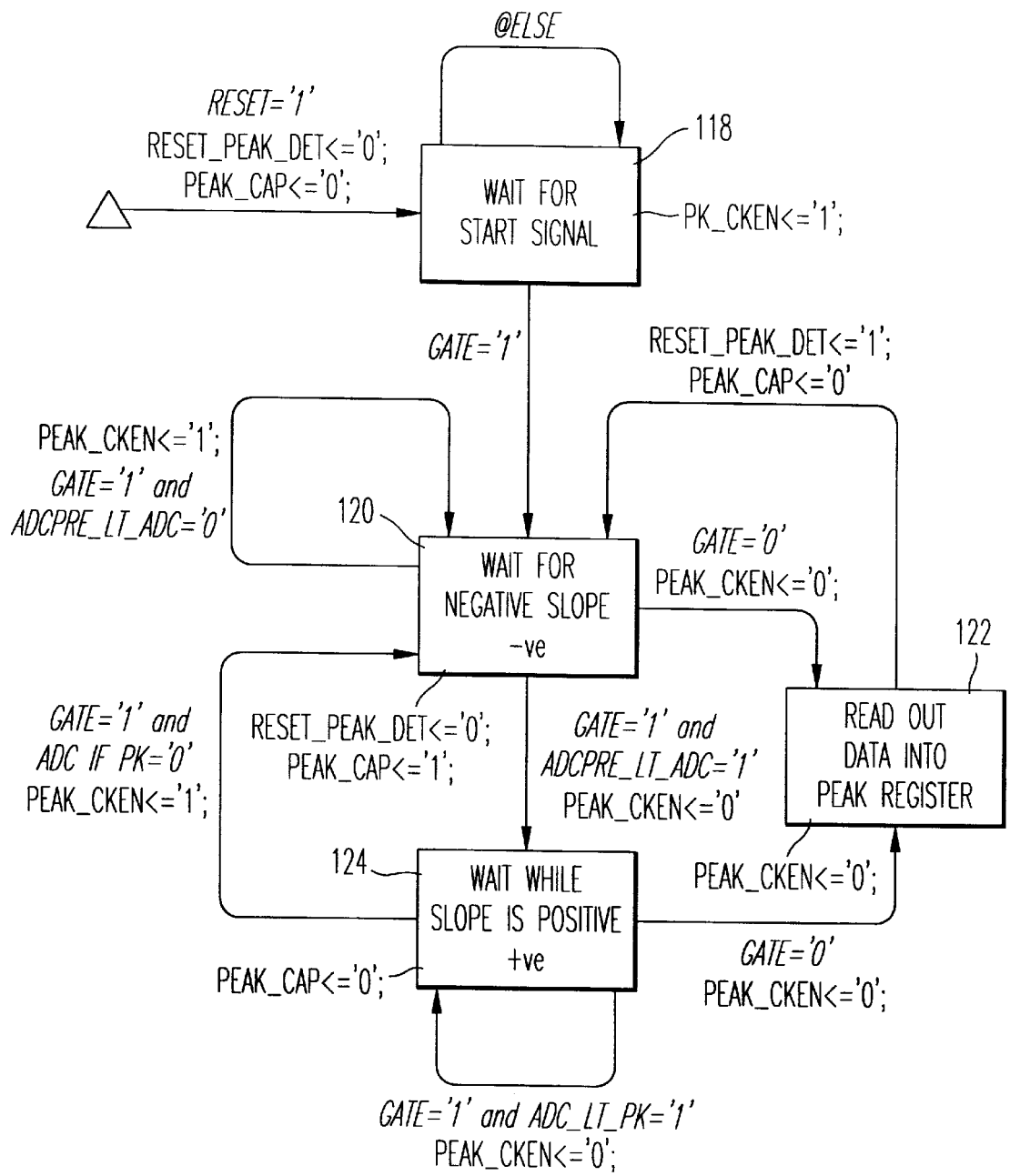
FIG. 12 is a state diagram for determining peak voltage in accordance with an embodiment of the present invention and the circuit depicted in FIG. 9.

A state diagram corresponding to the components depicted in FIG. 11 is provided in FIG. 12. The states depicted in FIG. 12 illustrate consideration of the slope of a sample signal to generate a more accurate peak measurement result. The peak detection clock enable signal PEAK_CKEN is running in the Wait state 118. The Wait state 118 is preferably only used after a reset operation. Peak detection commences when the start signal is received (i.e., GATE is set to "1"). The state machine controller 86 first operates in accordance with state 120 until a negative slope is detected. The state machine controller 86 remains in state 120 as long as the slope of the input signal is positive and no falling edge has been detected (i.e., GATE is "1" and ADCPRE_LT_ADC is "0"). Upon the occurrence of a falling edge in the sample signal, peak capture is disabled (i.e., GATE is set to "0"), and data is read to register PEAK0 (state 122). When ADCPRE_LT_ADC is "1", that is, the value of register ADC0 is greater than register ADC1, the state machine controller 86 continues to operate in state 124 while the slope is positive and acquire peak data. When GATE is "0" in state 124, the peak detection interval is terminated and the data is read into the register PEAK0. When negative slope is detected (i.e., GATE is "1" and ADCPRE_LT_ADC is "0"), the state machine controller 86 returns to the state 120 until a falling edge is detected.

The measurement of breakdown voltage of a sample 12 such as an insulated wire or a power cable has typically been carried out using analog systems. Analog systems are problematic when a sample breaks down because the transient generated as a result of the sample breaking down can disrupt a stored value such as a breakdown voltage. Analog systems are particularly problematic when a high series impedance is used for the coupling impedance 14. When using a high series impedance, output voltage can increase at the point of breakdown. In addition, when the voltage is at a significant rate, the lag imposed by prior measuring systems can impose significant inaccuracies in the result.

Figure 13:
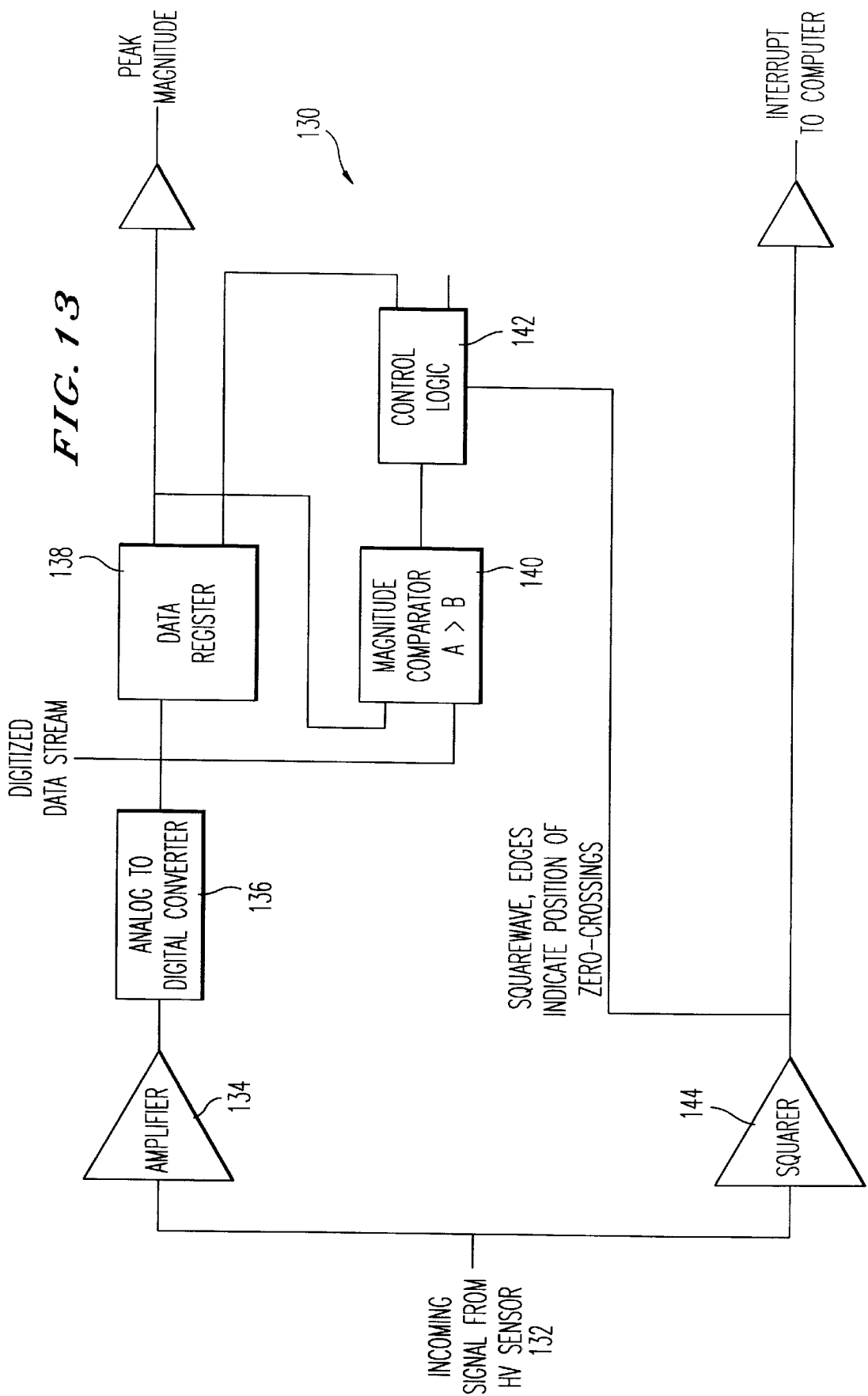
FIG. 13 is a system for determining breakdown voltage on a high voltage sample in accordance with an embodiment of the present invention.

In accordance with another embodiment of the present invention, a digital breakdown voltage detection circuit 130 in FIG. 13 is provided which uses high speed sampling of a high voltage signal combined with hardware and software for digital processing to produce an accurate measurement of breakdown voltage. With reference to FIG. 13, the hardware comprises a digital peak detector system which is similar to the peak detection system described in connection with FIG. 8. An incoming signal 132 from a high voltage sensor is amplified via amplifier 134 and then digitized at a high rate (e.g., more than 100 times the line frequency) to ensure that a peak is accurately captured using a high speed ADC 136. The output of the ADC 136 is provided to a data register 138 and to a magnitude comparator 140. If the magnitude comparator detects the output of the ADC 136 as being greater than that of the data register 138, control logic 142 latches the ADC 136 output data into the data register 138. The output of the data register 138, therefore, indicates the highest voltage read on the ADC since the data register was last cleared. The control logic is designed to clear the register when the register is read.

With continued reference to FIG. 13, the high voltage signal is also processed by a squaring circuit 144 which indicates transitions or zero-crossings of the waveform. The output of the squaring circuit 144 is provided to an interrupt input on the computer 28. The computer 28 can be programmed with an interrupt handler (FIG. 14) to read the peak detector and obtain peak voltage on each cycle of the high voltage waveform in the manner described above.

During breakdown testing of a sample, a finite delay exists which corresponds to the time elapsing between system detection of the sample breaking down and the removal of the high voltage from the sample. Due to the nature of control systems used in these applications, the finite delay can be on the order of several cycles on incoming power mains affected by the sample being tested. During the finite delay period, after the sample is broken down, a voltage reading is indeterminate and invalid. In accordance with the present invention, the computer 28 is programmed to store successive readings to a buffer associated therewith which is configured to hold several seconds of prior readings. The buffer stores a current set point for the output voltage. When the system detects that the sample has broken down, the software prevents the computer 28 from updating the buffer until the next time the voltage source 11 is turned on. The software controls the computer 28 to examine the end of the buffer and search backwards through the stored entries until the computer 28 locates a reading which is closest to the output voltage of a sample. The reading located by the computer 28 represents the last voltage that was applied to the sample, on a cycle-to-cycle basis, before the sample broke down.

Figure 14:
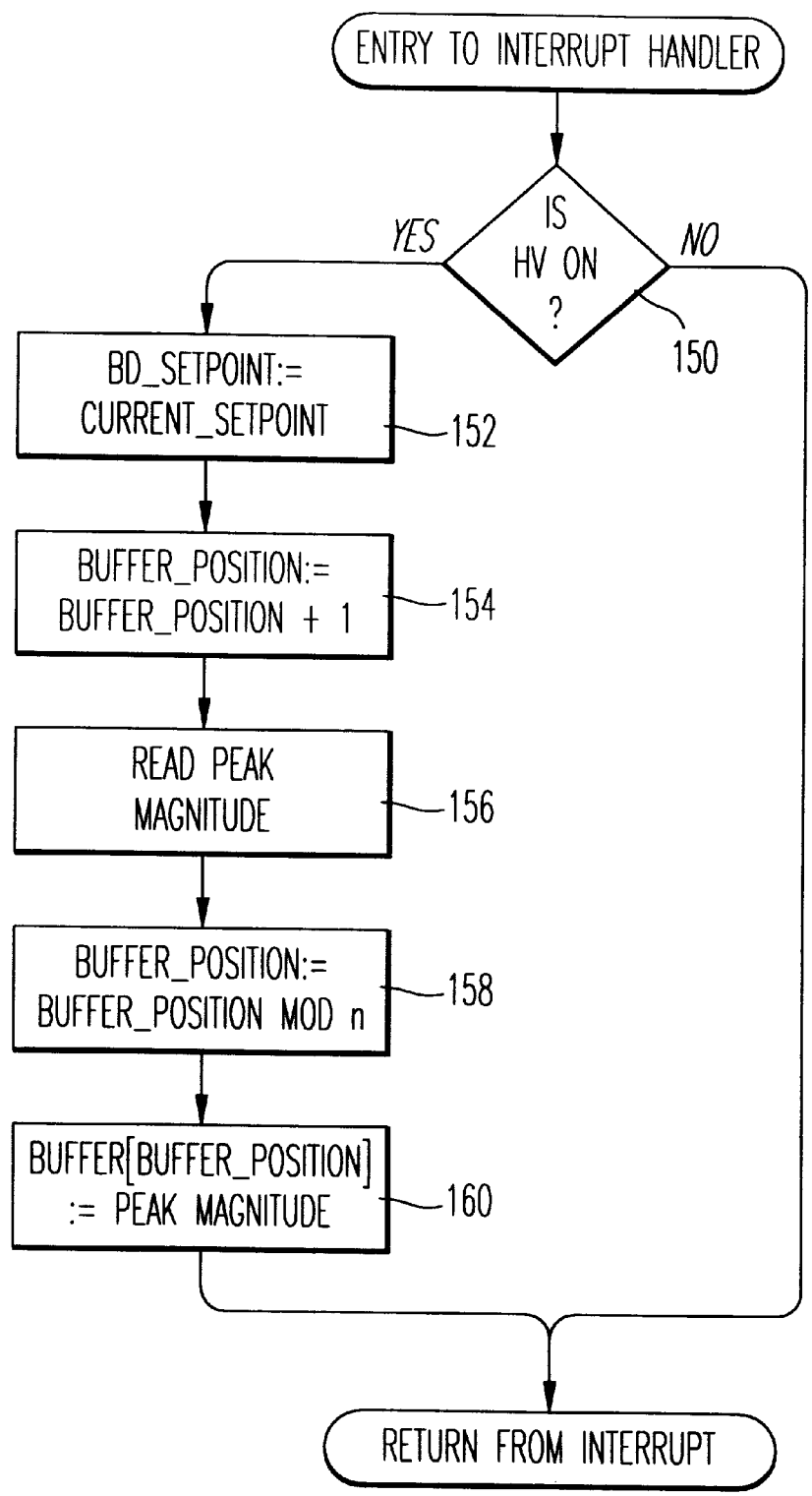
FIG. 14 is a flow chart depicting the sequence of operations for determining breakdown voltage in accordance with an embodiment of the present invention.

FIG. 14 illustrates the processing of the interrupt generated by the breakdown detection circuit 130 (FIG. 13) by the computer 28 each time the breakdown voltage detection circuit has measured the peak of the waveform. The computer 28 monitors the high voltage (HV) sensor 132 to see when it is on (block 150). If the HV sensor 132 is not on, the computer 28 exits the routine illustrated in FIG. 14. If the HV sensor 132 is on, the current setpoint is stored in BD_SETPOINT (block 152). The BUFFER_POSITION is advanced by one position (block 154). If the end of the buffer is reached, the parameter BUFFER_POSITION is set to the beginning of the buffer. The computer 28 reads the peak magnitude from the peak detection system in FIG. 13 (block 156) and stores peak magnitude in the buffer location indicated by BUFFER_POSITION (blocks 158 and 160). The computer 28 then exits from the interrupt handler illustrated in FIG. 14.

Figure 15:
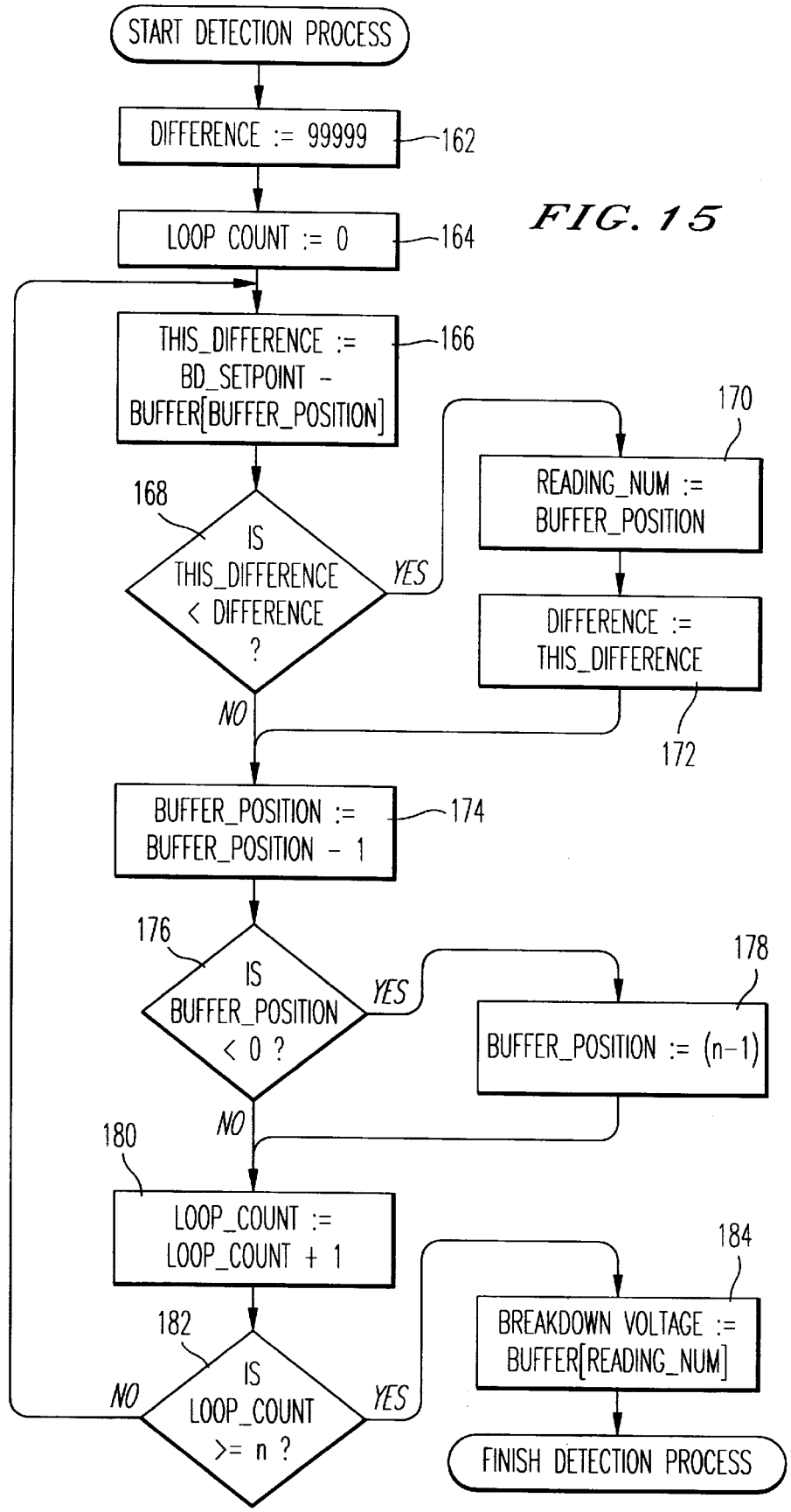
FIG. 15 is a flow chart depicting the sequence of operations in an interrupt handler in accordance with an embodiment of the present invention.

Once the system has detected that a breakdown of the sample has occurred, the computer 28 runs a breakdown voltage detection process in accordance with the present invention and illustrated in FIG. 15. The buffer stores the peak voltage of the last 'n' cycles in an array numbered 0 to (n–1). The position of the last reading is indicated by BUFFER_POSITION. The position of the earliest reading in the buffer is in location (BUFFER_POSITION +1). The setpoint that was on the system at the point of breakdown is stored in BD_SETPOINT. The process of determining the breakdown voltage involves searching back through the stored data to find the reading closest to the setpoint by looking at the differences. Initially, DIFFERENCE is set at 99999 (block 162), which is preferably higher than any possible reading. The loop counter is set to "0" (block 164). The difference between the current buffer reading and the setpoint, i.e., THIS_DIFFERENCE, is then calculated (block 166). If THIS_DIFFERENCE is less than DIFFERENCE (block 168), the buffer position is saved in READING_NUM (block 170) and DIFFERENCE is made equal to THIS_DIFFERENCE (block 172). The computer 28 then steps back one location in the buffer (block 174) and determines if the location is less than "0" (block 176). If the location is less than "0", BUFFER_POSITION is set to (n–1) so the search continues from the top of the buffer (block 178). The LOOP_COUNT is incremented (block 180). The computer 28 determines if all of the locations in the buffer have been read (block 182). If locations remain which have not been read, the computer 28 continues execution from block 166. When LOOP_COUNT =n, READING_NUM corresponds to the position in the buffer of the closest reading to BD_SETPOINT. The breakdown voltage is given by BUFFER[READING_NUM] (block 184).

In accordance with another embodiment of the present invention, a system is provided for concurrent digital measurement of peak voltage and root mean square (RMS) voltage in high voltage systems. High voltage testing specifications suggest using either RMS voltage, which is equivalent to a direct current (DC) heating effect, or peak-scaled-to-RMS voltage (i.e., peak/($\sqrt{2}$)) for the measurement of high voltage. The two measurements are identical if the high voltage signal being measured is a perfect sine wave. In a practical high voltage system, however, the high voltage signal is not a perfect sine wave and the two measurements disagree with each other. Whether one of the two measurements is used over the other measurement depends on the tests being performed. The measurement of both of these parameters using purely analog processes introduces inaccuracy into a high voltage system. For peak measurement, the peak capture circuit is designed to provide sufficient accuracy. For RMS measurement, on the other hand, design issues such as the long settling interval required for a converter to settle to a final value and a slow response to changes in the input are addressed. Use of an analog system for voltage feedback in a closed loop control system is therefore undesirable.

In accordance with the present invention, both peak voltage and RMS voltage are measured concurrently using a digital processing system 189. The incoming voltage is digitized at a high rate relative to the line frequency. A combination of hardware and software for digital processing is used to measure the peak-scaled-to-RMS voltage and the true RMS voltage of a high voltage signal.

With reference to FIG. 16, a signal from a high voltage sensor 190 is buffered using an amplifier 192 and provided to the input of an ADC 194. The ADC 194 samples at a frequency much higher than the high voltage line frequency (e.g., more than 100 times faster than the line frequency) to ensure that the peak of the waveform is captured with sufficient accuracy. The output of the ADC 194 is provided to a data register 196 and to a magnitude comparator 198. The output of the data register 196 is also provided to the magnitude comparator 198. The magnitude comparator 198 indicates to control logic 200 which of the two values in the data register 196 and the magnitude comparator 198, respectively, has the largest magnitude. Peak detection is preferably implemented in the same manner as described above in accordance with an embodiment of the present invention. If the output of the ADC 194 is larger than the value stored in the data register 196, the digital processing system 189 is programmed to write the output of the ADC 194 into the data register 196. The data register 196 indicates the peak value. When the data register 196 is read, control logic 200 is provided to ensure that the data register 196 is cleared and ready for the next use. By reading the register 196 at a rate equal to, or slower than, the line frequency, the peak magnitude output of the system 189 indicates the peak value of the high voltage signal since it was last read.

To read the true RMS value, software is provided in conjunction with hardware to calculate the RMS-to-peak factor. The hardware comprises a clock source running at some multiple of the line frequency. The clock source can be obtained from the squaring circuit 202 driven by the high voltage signal which then drives a phase lock loop system 204 for multiplying the line frequency by a known amount n. The clock signal is then used to drive a memory 206 which stores n samples of the incoming waveform. In accordance with the software, the computer 28 periodically reads the contents of the memory 206, which provides n voltages. The n voltages are combined to give a peak-to-RMS scaling factor for the waveform using the calculation:

$$f = \frac{1}{n V_{pk}} \times \sum_{k=0}^{k=n-1} V_k^2$$

wherein, $V_{pk}$ is the largest voltage in the cycle as read from the peak magnitude output, $V_k$ is the voltage recorded in a memory location k, and n is the number of memory locations which corresponds to a line frequency multiplication factor. For any particular main cycle, both the peak voltage and the true RMS voltage can be calculated using the digital processing system 189 and the computer 28 in the manner disclosed herein. In normal uses, it is not necessary to calculate the peak-to-RMS scaling factor $f$ every cycle since the waveform does not change on a per cycle basis. The factor $f$ can, instead, be recalculated every second or every other second with no significant degradation in accuracy.

While various embodiments have been chosen to illustrate the invention, it will be understood by those skilled in the art that various changes and modifications can be made therein without departing from the scope of the invention as defined in the appended claims.

What is claimed is:

1. A breakdown voltage measurement system for measuring the voltage of a sample electrical device following breakdown comprising:
    an amplifier connected to said sample electrical device for amplifying a signal presented at the output of said sample electrical device when energized via said alternating current source;
    a digitizer connected to said amplifier for digitizing said signal, said signal comprising pulses;
    a digital peak detector connected to said digitizer and comprising a capture memory device, said digital peak detector being programmed to generate pulse capture windows, to determine changes in the polarity of said signal, and to control when data relating to at least one of said pulses occurring in at least one of said pulse capture windows is stored in said capture memory device in accordance with said pulse capture windows and the polarity of said signal;
    a voltage memory device for storing peak values read from said capture memory device at predetermined intervals; and
    a processing device programmed to store a plurality of successive ones of said peak values and to select one of said peak values in said voltage memory device to represent said voltage of said sample electrical device following breakdown of said sample electrical device.

2. A breakdown voltage measurement system as claimed in claim 1, further comprising a squaring circuit connected to said sample electrical device and operable to generate a square wave signal corresponding to said signal from said sample electrical device, said square wave signal being provided to said processing device to indicate when said signal crosses a zero-voltage reference point, said processing device being programmable to perform an interrupt routine when said signal crosses said zero-voltage reference point to read a peak value determined by said digital peak detector from said capture memory device.

3. A breakdown voltage measurement system as claimed in claim 1, further comprising a squaring circuit connected to said sample electrical device and operable to generate a square wave signal corresponding to said signal from said sample electrical device, said square wave signal being provided to said digital peak detector to indicate when said signal crosses a zero-voltage reference point, said digital peak detector being operable to control the duration of said pulse capture windows in accordance with when said signal crosses said zero-voltage reference point.

4. A method of measuring the voltage from an electrical device following breakdown comprising the steps of:
    measuring the peaks of pulses generated by said electrical device;
    storing values corresponding to successive measurements of said peaks in respective locations in a memory device;
    storing a current set-point corresponding to said voltage at the output of said electrical device when each of said peaks is detected; and
    examining said values successively and beginning with the most recently stored one of said values following a breakdown of said electrical device to determine which of said values corresponds most closely to said set-point stored when said breakdown occurred.

5. A method as claimed in claim 4, wherein said measuring step comprises the steps of:
    digitizing said pulses;
    storing data relating to a first portion of one of said pulses in a first buffer and data relating to a subsequent second portion of said pulse in a second buffer;
    comparing said data relating to said first portion with said data relating to said second portion to determine which has the greatest magnitude; and
    providing said data relating to said second portion to said first buffer if said second portion has a greater magnitude than the corresponding said first portion.

6. A method as claimed in claim 5, wherein said measuring step further comprises the step of capturing said data during a capture window of variable duration if a pulse capture and analysis mode is selected.

7. A method as claimed in claim 6, further comprising the step of determining when said pulse crosses a zero-voltage reference point, said capture window of variable duration terminating when said pulse crosses said zero-voltage reference point.

8. A method as claimed in claim 6, further comprising the steps of:
    determining the polarity of said pulses, said capture window of variable duration commencing when one of said pulses has positive polarity and preceding ones of said pulses have negative polarity;
    determining when said one of said pulses crosses a zero-voltage reference point; and
    terminating said capture window of variable duration when said one of said pulses crosses said zero-voltage reference point.

* * * * *